(12) United States Patent
Suzuki

(10) Patent No.: US 9,887,091 B2
(45) Date of Patent: Feb. 6, 2018

(54) WAFER PROCESSING METHOD

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/704,605

(22) Filed: May 5, 2015

(65) Prior Publication Data

US 2015/0332909 A1    Nov. 19, 2015

(30) Foreign Application Priority Data

May 13, 2014    (JP) .................................. 2014-099577

(51) Int. Cl.

| | | |
|---|---|---|
| H01B 13/00 | (2006.01) | |
| B44C 1/22 | (2006.01) | |
| C03C 15/00 | (2006.01) | |
| C03C 25/68 | (2006.01) | |
| C23F 1/00 | (2006.01) | |
| H01L 21/302 | (2006.01) | |
| H01L 21/461 | (2006.01) | |
| H01L 21/311 | (2006.01) | |
| H01L 21/304 | (2006.01) | |
| H01L 21/02 | (2006.01) | |
| H01L 23/544 | (2006.01) | |
| B24B 1/00 | (2006.01) | |
| H01L 41/338 | (2013.01) | |

(Continued)

(52) U.S. Cl.
CPC .............. *H01L 21/304* (2013.01); *B24B 1/00* (2013.01); *B24B 7/228* (2013.01); *B24B 19/02* (2013.01); *H01L 21/02013* (2013.01); *H01L 21/02016* (2013.01); *H01L 21/02019* (2013.01); *H01L 21/67092* (2013.01); *H01L 21/6836* (2013.01); *H01L 21/78* (2013.01); *H01L 23/544* (2013.01); *H01L 41/338* (2013.01); *H01L 2221/68327* (2013.01); *H01L 2924/0002* (2013.01)

(58) Field of Classification Search
None
See application file for complete search history.

(56) References Cited

U.S. PATENT DOCUMENTS

2003/0119281 A1 *    6/2003    Suzuki ................ H01L 29/0657
                                                                          438/460
2006/0244096 A1 *    11/2006  Sekiya .................... H01L 21/78
                                                                          257/510

(Continued)

FOREIGN PATENT DOCUMENTS

JP    2007-19461    1/2007
JP    2011-61137    3/2011

*Primary Examiner* — Stephanie Duclair
(74) *Attorney, Agent, or Firm* — Greer Burns & Crain, Ltd.

(57) ABSTRACT

A method of processing a wafer includes: a grinding step of grinding a back surface of the wafer to form, on the back side of the wafer, a recess corresponding to a device region and an annular projecting portion corresponding to a peripheral marginal region; and a splitting groove forming step of forming, after the grinding step is conducted, a splitting groove for splitting the device region and the peripheral marginal region from each other at the boundary between the recess and the annular projecting portion, the splitting groove extending from the front surface of the wafer to reach the back surface of the wafer. The splitting groove is formed by dry etching.

7 Claims, 5 Drawing Sheets

(51) Int. Cl.
   *H01L 21/683* (2006.01)
   *H01L 21/78* (2006.01)
   *H01L 21/67* (2006.01)
   *B24B 19/02* (2006.01)
   *B24B 7/22* (2006.01)

(56) References Cited

U.S. PATENT DOCUMENTS

2010/0048001 A1    2/2010   Harikai et al.
2012/0322231 A1*   12/2012   Kim ................... H01L 21/561
                                                             438/460

* cited by examiner

WAFER PROCESSING METHOD

BACKGROUND OF THE INVENTION

Field of the Invention

The present invention relates to a method for processing a wafer into a thinner form.

Description of the Related Art

In recent years, in order to realize smaller and lighter devices, there has been a demand for processing wafers formed of silicon or the like into a thinner form. A wafer is, for example, thinned by grinding the back side thereof after devices such as ICs are formed in regions sectioned by predetermined division lines (streets) on the front surface thereof.

Meanwhile, when a wafer is thinned by grinding, the wafer is greatly lowered in rigidity and becomes difficult to handle in the subsequent steps. In consideration of this problem, a processing method for permitting a wafer to retain a predetermined rigidity after grinding thereof has been proposed in which the back side of a wafer is ground in correspondence to a central device region while maintaining the thickness of a peripheral portion of the wafer (see, for example, Japanese Patent Laid-open No. 2007-19461). In this processing method, the back side of a wafer is ground, for example, by use of a grinding wheel smaller than the wafer in diameter to form a recess corresponding to the device region. The rigidity of the wafer is retained by an annular reinforcement portion (annular projecting portion) remaining on the back side of the peripheral marginal region surrounding the device region. Incidentally, the annular projecting portion is removed later by such a method as cutting (see, for example, Japanese Patent Laid-open No. 2011-61137).

SUMMARY OF THE INVENTION

The aforementioned recess corresponding to the device region is often formed in a shape in which a bottom surface and a side surface are joined to each other through a curved surface. A recess of such a shape is formed because a corner portion or portions of a grindstone or grindstones of a grinding wheel become rounded through abrasion as the grinding proceeds. In other words, the roundness formed at the corner portion(s) of the grindstone(s) due to abrasion is transferred to the wafer, whereby a curved shape (R-shape) is generated at the joining portion between the bottom surface and the side surface of the recess.

The annular reinforcement portion is usually removed by causing a cutting blade to cut into the joining portion between the bottom surface and the side surface of the recess. When the cutting blade is made to cut into the joining portion which is R-shaped as aforementioned, however, a force in a bending direction arising from the R-shape is exerted on the cutting blade, thereby bending the cutting blade. Thus, there has been the problem of breakage of a wafer in such a situation.

If the cutting blade is made to cut into a flat region of the bottom surface of the recess which region is selected while avoiding the R-shape, it is possible to prevent such a problem as the breakage of the wafer due to the bending of the cutting blade. In that case, however, the device region is narrowed, making it impossible to securely obtain a sufficient number of devices from the wafer.

It is an object of the present invention to provide a wafer processing method by which breakage of a wafer can be prevented from occurring and a sufficient number of devices can be securely obtained from the wafer.

In accordance with an aspect of the present invention, there is provided a method of processing a wafer having a device region in which devices are formed respectively in regions on a front surface of the wafer sectioned by a plurality of crossing predetermined division lines and a peripheral marginal region surrounding the device region, the method including: a grinding step of grinding a back surface of the wafer to form, on a back side of the wafer, a recess corresponding to the device region and an annular projecting portion corresponding to the peripheral marginal region; and a splitting groove forming step of forming, after the grinding step is conducted, a splitting groove for splitting the device region and the peripheral marginal region from each other at a boundary between the recess and the annular projecting portion, the splitting groove extending from the front surface of the wafer to reach the back surface of the wafer, wherein the splitting groove is formed by dry etching.

The method of processing a wafer as above may further include a dividing step of forming dividing grooves along the predetermined division lines by dry etching, the dividing grooves extending from the front surface of the wafer to reach the back surface of the wafer, and dividing the wafer along the predetermined division lines, and the dividing step may be performed simultaneously with the splitting groove forming step.

The method of processing a wafer as above may further include a front surface protective member disposing step of disposing a front surface protective member on the front surface of the wafer before the grinding step is conducted; and a mask forming step of forming a mask on the back surface of the wafer after the grinding step is performed and before the splitting groove forming step and the dividing step are conducted, the mask being such that a back surface region corresponding to the splitting groove formed at the boundary between the recess and the annular projecting portion and back surface regions corresponding to the predetermined division lines are exposed.

According to the wafer processing method of the present invention, the splitting groove forming step of forming the splitting groove at the boundary between the recess and the annular projecting portion by dry etching is conducted after the grinding step of grinding the back side of the wafer to form the recess and the annular projecting portion, so that it is possible to form the splitting groove and remove the annular projecting portion without causing a cutting blade to cut into the wafer, and, therefore, it is possible to prevent such a problem as breakage of the wafer due to bending of a cutting blade. In addition, since it is unnecessary to form the splitting groove while avoiding the boundary between the recess and the annular projecting portion, it is possible to securely obtain a sufficient number of devices from the wafer. Thus, according to the present invention, there can be provided a wafer processing method by which breakage of a wafer can be prevented from occurring and a sufficient number of devices can be securely obtained from the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Some embodiments of the present invention will be described below, referring to the attached drawings. In a first embodiment below, description will be made of a method of processing a wafer wherein a splitting groove forming step of forming the wafer with a splitting groove for splitting a device region and a peripheral marginal region from each other and a dividing step of dividing the wafer along predetermined division lines are carried out simultaneously. In a second embodiment below, description will be made of a method of processing a wafer wherein the splitting groove forming step and the dividing step are carried out at different timings.

First Embodiment

In this embodiment, a method of processing a wafer wherein a splitting groove forming step and a dividing step are carried out simultaneously will be described. The wafer processing method according to this embodiment includes a front surface protective member disposing step (see FIGS. 1B and 1C), a grinding step (see FIGS. 2A and 2B), a mask forming step (see FIG. 3A), a splitting groove forming step (see FIG. 3B), and a dividing step (see FIG. 3B). In the front surface protective member disposing step, a protective member is disposed on the front side of the wafer. In the grinding step, the back side of the wafer is ground, to form a recess corresponding to a device region and an annular projecting portion corresponding to a peripheral marginal region. In the mask forming step, a mask is formed on the back side of the wafer, the mask being such that a region corresponding to a boundary between the recess and the annular projecting portion and regions corresponding to predetermined division lines are exposed. In the splitting groove forming step, dry etching is applied to the wafer from the back side of the wafer, to form a splitting groove at the boundary between the recess and the annular projecting portion. In the dividing step, dry etching is applied to the wafer from the back side of the wafer, to form dividing grooves corresponding to the predetermined division lines. It is to be noted that in this embodiment, the splitting groove forming step and the dividing step are carried out simultaneously. The wafer processing method according to this embodiment will now be described in detail below.

Figure 1A:
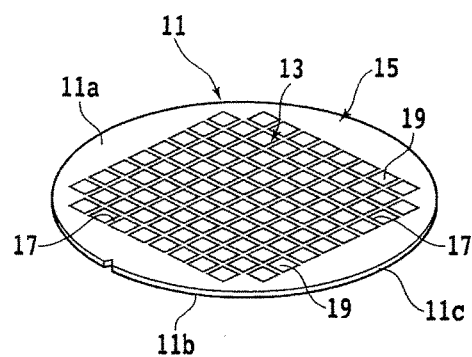
FIG. 1A is a perspective view showing schematically an example of a wafer.

FIG. 1A is a perspective view showing schematically an example of a wafer to be processed by the wafer processing method according to this embodiment. As illustrated in FIG. 1A, a wafer 11 is, for example, a disk-shaped semiconductor wafer formed of such a material as silicon, of which a front surface 11a is divided into a central device region 13 and a peripheral marginal region 15 surrounding the device region 13. The device region 13 is further sectioned by predetermined division lines (streets) 17 arranged in a grid pattern, into a plurality of regions, with a device 19 such as an IC formed in each of these regions. A periphery 11c of the wafer 11 is chamfered, to be roughly arcuate in cross section.

Figure 1B:
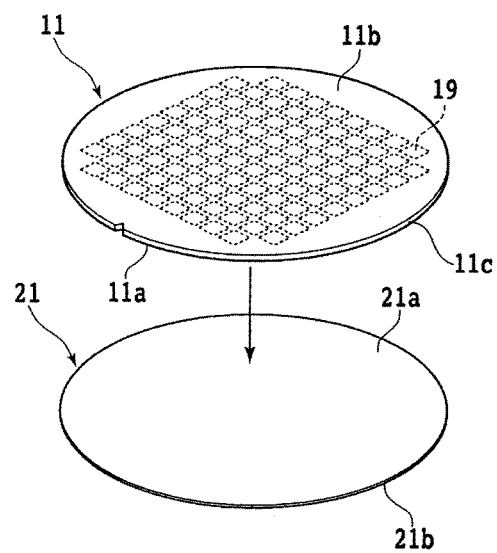
FIG. 1B is a perspective view showing schematically a front surface protective member disposing step.
Figure 1C:
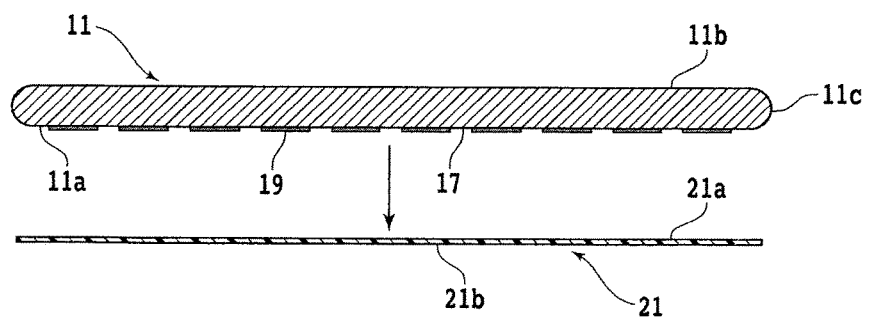
FIG. 1C is a sectional view showing schematically a front surface protective member disposing step.

In the wafer processing method according to this embodiment, first, a front surface protective member disposing step is carried out in which a protective member is disposed on the side of the front surface 11a of the wafer 11 mentioned above. FIG. 1B is a perspective view depicting schematically the front surface protective member disposing step, and FIG. 1C is a sectional view showing schematically the front surface protective member disposing step. As illustrated in FIGS. 1B and 1C, the protective member 21 is formed in a disk-like shape which is substantially the same as the shape of the wafer 11. As the protective member 21, there can be used, for example, a resin substrate, an adhesive tape, or a wafer similar to the wafer 11.

In the front surface protective member disposing step, the front surface 11a side of the wafer 11 is faced to a front surface 21a side of the protective member 21, and the wafer 11 and the protective member 21 are stacked in this relation. In this case, an adhesive or the like is preliminarily interposed between the front surface 11a of the wafer 11 and the front surface 21a of the protective member 21. This results in that the protective member 21 is fixed onto the front surface 11a side of the wafer 11, with the adhesive or the like therebetween.

Figure 2A:
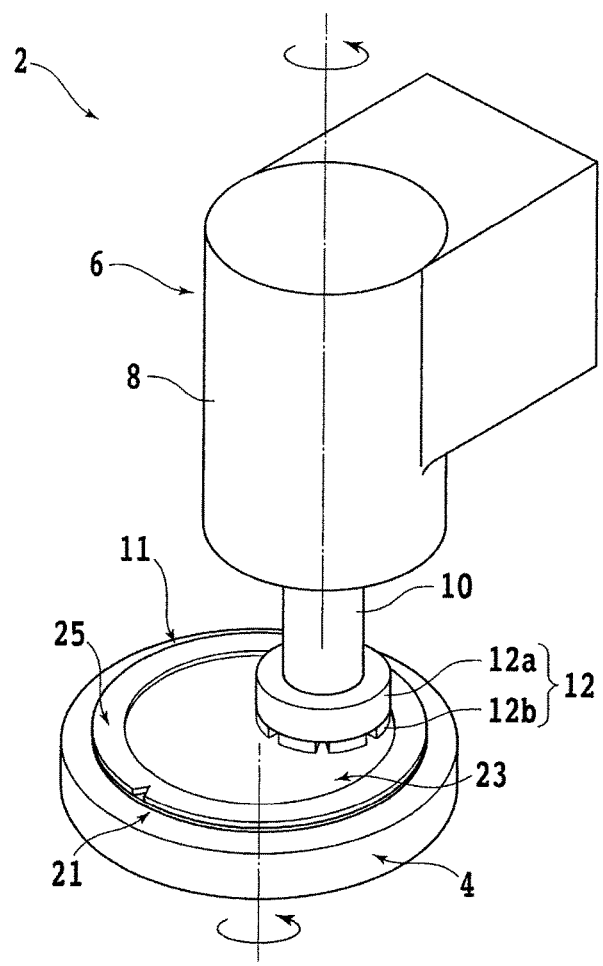
FIG. 2A is a perspective view showing schematically a grinding step.
Figure 2B:
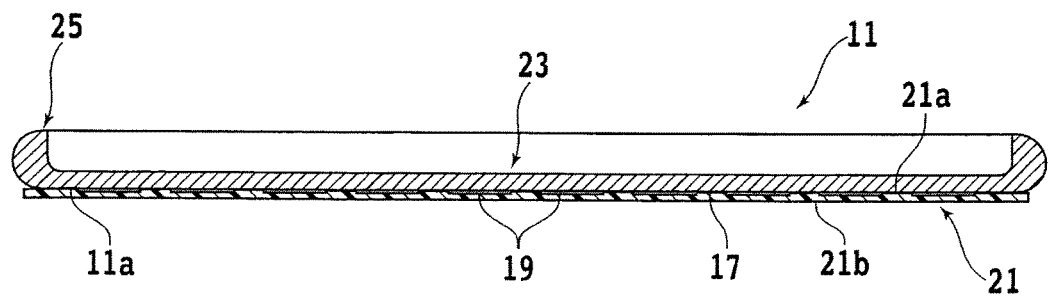
FIG. 2B is a sectional view showing schematically a wafer and the like after the grinding step is carried out.

After the front surface protective member disposing step is performed, the grinding step is carried out in which the back surface 11b side of the wafer 11 is ground to form a recess and an annular projecting portion. FIG. 2A is a perspective view showing schematically the grinding step, and FIG. 2B is a sectional view depicting schematically the wafer and the like after the grinding step is conducted. As illustrated in FIG. 2A, the grinding step is carried out by a grinding apparatus 2. The grinding apparatus 2 has a holding table 4 for holding the wafer 11 by suction. The holding table 4 is connected to a rotating mechanism (not shown) such as a motor, and is rotated about a rotational axis extending in the vertical direction. In addition, a moving mechanism (not shown) is provided under the holding table 4, and the holding table 4 is moved horizontally by the moving mechanism. A surface (upper surface) of the holding table 4 constitutes a holding surface on which the wafer 11 is held by suction. At the holding surface, a negative pressure of a suction source (not shown) is applied through a conduit (not shown) formed in the inside of the holding table 4, whereby a suction force for sucking the wafer 11 is generated. Over the holding table 4 is disposed a grinding mechanism 6. The grinding mechanism 6 has a spindle housing 8 supported by a lifting mechanism (not shown). In the spindle housing 8, a spindle 10 connected to a rotating mechanism (not shown) such as a motor is rotatably housed. The spindle 10 is rotated about a rotational axis extending in the vertical direction by a rotating force transmitted from the rotating mechanism, and is moved upward and downward together with the spindle housing 8 by the lifting mechanism. The spindle 10 is equipped on a lower end side thereof with a grinding wheel 12 which is smaller in diameter than the wafer 11. The grinding wheel 12 has a wheel base 12a formed of a metallic material such as aluminum and stainless steel. The wheel base 12a has an annular lower surface, over the whole circumference of which a plurality of grindstones 12b are fixed.

In the grinding step, first, a back surface 21b of the protective member 21 fixed onto the wafer 11 is put in contact with the holding surface of the holding table 4, and the negative pressure of the suction source is applied there. As a result, the wafer 11 is suction held onto the holding table 4, with its back surface 11b side exposed upward. Next, the holding table 4 is moved so that outer peripheral edges of the grindstones 12b are positioned in a region corresponding to the boundary between the device region 13 and the peripheral marginal region 15. In this condition, the holding table 4 and the grinding wheel 12 are rotated, and the spindle 10 is moved downward. The amount of downward movement of the spindle 10 is set to such an extent that the lower surfaces of the grindstones 12b are pressed against the back surface 11b side of the wafer 11. By this operation, a region on the back surface 11b side of the wafer 11 which corresponds to the device region 13 can be ground by the grindstones 12b so as to form a recess 23 corresponding to the device region 13, while leaving an annular projecting portion (reinforcement portion) 25 corresponding to the peripheral marginal region 15. The grinding step is finished when, for example, the region corresponding to the device region 13 has been ground to a finished thickness.

Figure 3A:
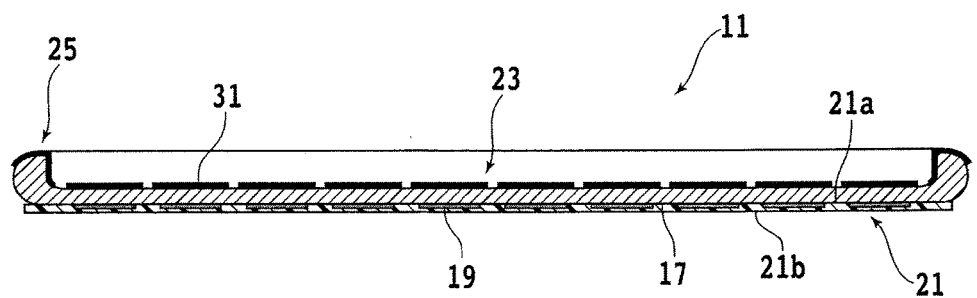
FIG. 3A is a sectional view depicting schematically a mask forming step.

After the grinding step is conducted, the mask forming step is carried out in which a mask such that a region corresponding to the boundary between the recess 23 and the annular projecting portion 25 and regions corresponding to the predetermined division lines 17 are exposed is formed on the back surface 11b side of the wafer 11. FIG. 3A is a sectional view showing schematically the mask forming step. In the mask forming step in this embodiment, the mask 31 in a predetermined pattern is formed on the back surface 11b side of the wafer 11 by an arbitrary method. For example, a mask pattern (not shown) formed with openings corresponding to the mask 31 to be formed is laid on the back surface 11b side of the wafer 11, and a resist material containing a dry etching-resistant resin or the like is dropped toward the openings of the mask pattern. Thereafter, the resist material is cured by a drying treatment, a heating treatment or the like, and the mask pattern is removed from the back surface 11b side of the wafer 11. Such conditions as heating temperature and treating time are set according to the kind of the resist material and the like. As a result, there can be formed the mask 31 such that the region corresponding to the boundary between the recess 23 and the annular projecting portion 25 and the regions corresponding to the predetermined division lines 17 are exposed.

Figure 3B:
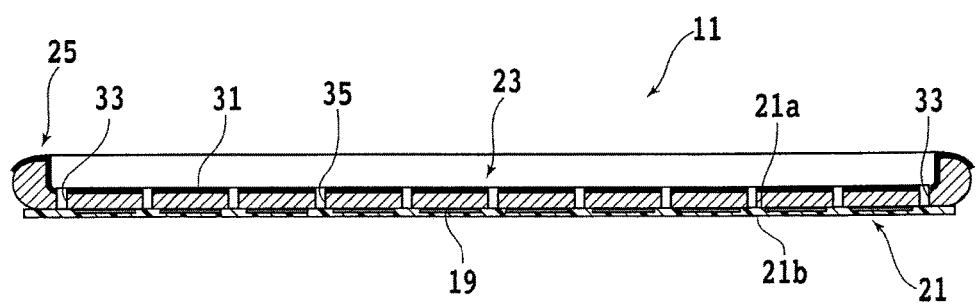
FIG. 3B is a sectional view showing schematically a splitting groove forming step and a dividing step.

After the mask forming step is performed, the splitting groove forming step of forming a splitting groove at the boundary between the recess 23 and the annular projecting portion 25 and the dividing step of forming dividing grooves corresponding to the predetermined division lines 17 are simultaneously carried out. FIG. 3B is a sectional view showing schematically the splitting groove forming step and the dividing step. In the splitting groove forming step and the dividing step, for example, a predetermined plasma is applied to the back surface 11b side of the wafer 11 so that the regions not covered with the mask 31 are subjected to dry etching (plasma etching). For instance, in the case where the wafer 11 is formed of silicon, a plasma generated by use of a fluorine-containing gas represented by $SF_6$ and $C_4F_8$ may be applied. While the etching time may be arbitrarily set, it is so set as to ensure at least that a splitting groove 33 extending from the back surface 11b side of the wafer 11 to reach the front surface 11a side of the wafer 11 can be formed at the boundary between the recess 23 and the annular projecting portion 25 and that dividing grooves 35 extending from the back surface 11b side of the wafer 11 to reach the front surface 11a side of the wafer 11 can be formed along the predetermined division lines 17 of the wafer 11.

By the operation as above, the wafer 11 can be split into the device region 13 and the peripheral marginal region 15, and, in addition, can be divided along the predetermined division lines 17. In this embodiment, the splitting groove forming step and the dividing step are conducted simultaneously, so that the process can be simplified and the cost therefor can be reduced as compared with the case where the splitting groove forming step and the dividing step are carried out at different timings. A plurality of chips formed by the division of the wafer 11 are, for example, picked up by an arbitrary picking-up mechanism after an annular projecting portion removing step of removing the annular projecting portion 25 is conducted.

Thus, in the wafer processing method according to this embodiment, the splitting groove forming step of forming the splitting groove 33 at the boundary between the recess 23 and the annular projecting portion 25 by dry etching is carried out after the grinding step of grinding the back surface 11b side of the wafer 11 to form the recess 23 and the annular projecting portion 25, and, therefore, it is possible to form the splitting groove 33 and remove the annular projecting portion 25 without causing a cutting blade to cut into the wafer 11. Accordingly, such a trouble as breakage of the wafer 11 due to bending of a cutting blade can be prevented from occurring. Besides, since it is unnecessary to form the splitting groove 33 while avoiding the boundary between the recess 23 and the annular projecting portion 25, a sufficient number of devices 19 can be securely obtained from the wafer 11. In other words, according to this embodiment, there is provided a wafer processing method by which breakage of the wafer 11 can be prevented from occurring and a sufficient number of devices 19 can be securely obtained from the wafer 11.

Second Embodiment

In this embodiment, a wafer processing method in which a splitting groove forming step and a dividing step are carried out at different timings will be described. The wafer processing method according to this embodiment includes a front surface protective member disposing step (see FIGS. 1B and 1C), a grinding step (see FIGS. 2A and 2B), a transferring step (see FIG. 4A), a mask forming step (see FIG. 4B), a splitting groove forming step (see FIG. 4C), an annular projecting portion removing step (see FIG. 4D), and a dividing step (see FIG. 5). In the front surface protective member disposing step, a protective member 21 is disposed on a front surface 11a side of a wafer 11. In the grinding step, a back surface 11b side of the wafer 11 is ground to form a recess 23 corresponding to a device region 13 and an annular projecting portion 25 corresponding to a peripheral marginal region 15. In the transferring step, a dicing tape is attached to the back surface 11b side of the wafer 11, and the protective member 21 disposed on the front surface 11a side of the wafer 11 is removed. In the mask forming step, a mask such that the boundary between the recess 23 and the annular projecting portion 25 is exposed is formed on the front surface 11a side of the wafer 11. In the splitting groove forming step, dry etching is applied to the wafer 11 from the front surface 11a side of the wafer 11 to form a splitting groove at the boundary between the recess 23 and the annular projecting portion 25. In the annular projecting portion removing step, the annular projecting portion 25 split from the rest of the wafer 11 is removed. In the dividing step, the wafer left after the removal of the annular projecting portion 25 is cut from the front surface 11a side thereof, to form dividing grooves corresponding to predetermined division lines 17. The wafer processing method according to this embodiment will now be described in detail below.

In the wafer processing method according to this embodiment, first, the front surface protective member disposing step of disposing the protective member 21 on the front surface 11a side of the wafer 11 is carried out. After the front surface protective member disposing step is performed, the grinding step is carried out in which the back surface 11b side of the wafer 11 is ground to form the recess 23 corresponding to the device region 13 and the annular projecting portion 25 corresponding to the peripheral marginal region 15. The front surface protective member disposing step and the grinding step in this embodiment can be carried out in the same manner as the front surface protective member disposing step and the grinding step in the first embodiment, and, therefore, detailed description of these steps is omitted here.

Figure 4A:
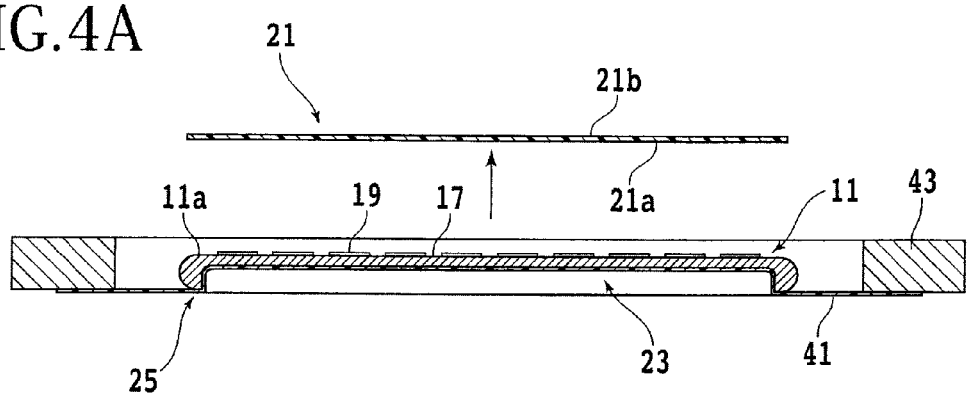
FIG. 4A is a sectional view showing schematically a transferring step.

After the grinding step is performed, the transferring step is carried out in which the dicing tape is attached to the back surface 11b side of the wafer 11 and the protective member 21 disposed on the front surface 11a side of the wafer 11 is removed. FIG. 4A is a sectional view which schematically illustrates the transferring step. As shown in FIG. 4A, in the transferring step, a dicing tape 41 larger than the wafer 11 in diameter is attached to the back surface 11b side of the wafer 11. To a peripheral portion of this dicing tape 41 is fixed an annular frame 43. In other words, the wafer 11 is held by the annular frame 43 through the dicing tape 41. In addition, the protective member 21 disposed on the front surface 11a side of the wafer 11 is removed. This results in that the front surface 11a side of the wafer 11 is exposed. It is to be noted that the removal of the protective member 21 may be performed before the attachment of the dicing tape 41 or after the attachment of the dicing tape 41.

Figure 4B:
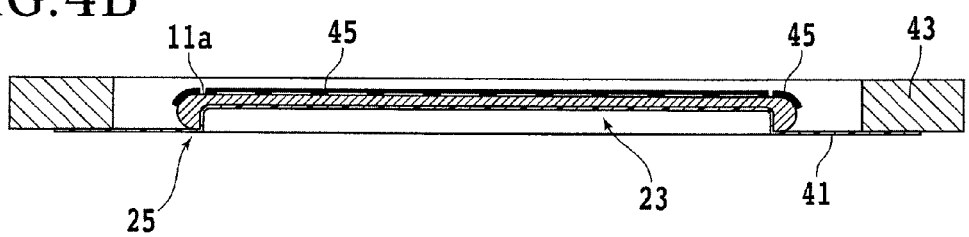
FIG. 4B is a sectional view showing schematically a mask forming step.

After the transferring step is conducted, the mask forming step is carried out in which the mask such that the boundary between the recess 23 and the annular projecting portion 25 is exposed is formed on the front surface 11a side of the wafer 11. FIG. 4B is a sectional view which schematically depicts the mask forming step. As shown in FIG. 4B, in this embodiment, there is formed a mask 45 such that the boundary between the recess 23 and the annular projecting portion 25 is exposed but regions corresponding to predetermined division lines 17 are not exposed. It is to be noted here, however, that there may be formed a mask such that both the region corresponding to the boundary between the recess 23 and the annular projecting portion 25 and the regions corresponding to the predetermined division lines 17 are exposed. In that case, the splitting groove forming step and the dividing step can be carried out simultaneously, like in the first embodiment.

Figure 4C:
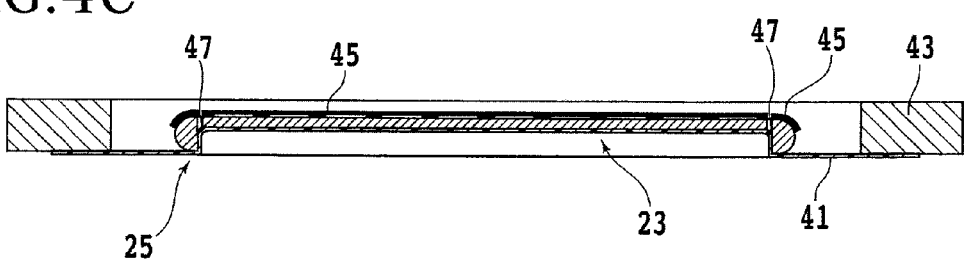
FIG. 4C is a sectional view showing schematically a splitting groove forming step.

After the mask forming step is performed, the splitting groove forming step of forming the splitting groove at the boundary between the recess 23 and the annular projecting portion 25 is carried out. FIG. 4C is a sectional view which schematically shows the splitting groove forming step. In the splitting groove forming step in this embodiment, for example, a plasma is applied to the front surface 11a side of the wafer 11, whereby the region not covered with the mask 45 is subjected to dry etching (plasma etching). As a result, a splitting groove 47 for splitting the wafer 11 into the device region 13 and the peripheral marginal region 15 can be formed.

Figure 4D:
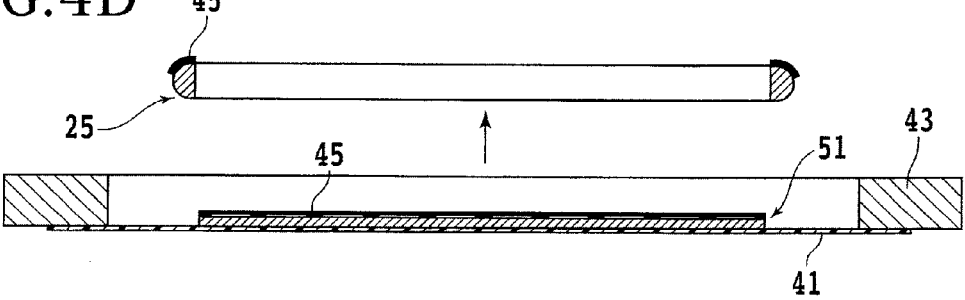
FIG. 4D is a sectional view showing schematically an annular projecting portion removing step.

After the splitting groove forming step is conducted, the annular projecting portion removing step is carried out in which the annular projecting portion 25 split from the rest of the wafer 11 is removed. FIG. 4D is a sectional view which schematically shows the annular projecting portion removing step. Since the device region 13 and the peripheral marginal region 15 have been split from each other by the splitting groove 47, as shown in FIG. 4D, it is possible to easily remove the annular projecting portion 25 to obtain a wafer 51 which corresponds to the device region 13 and which has been thinned. Incidentally, it is preferable to preliminarily remove the mask 45 at an arbitrary timing after the splitting groove forming step is carried out.

Figure 5:
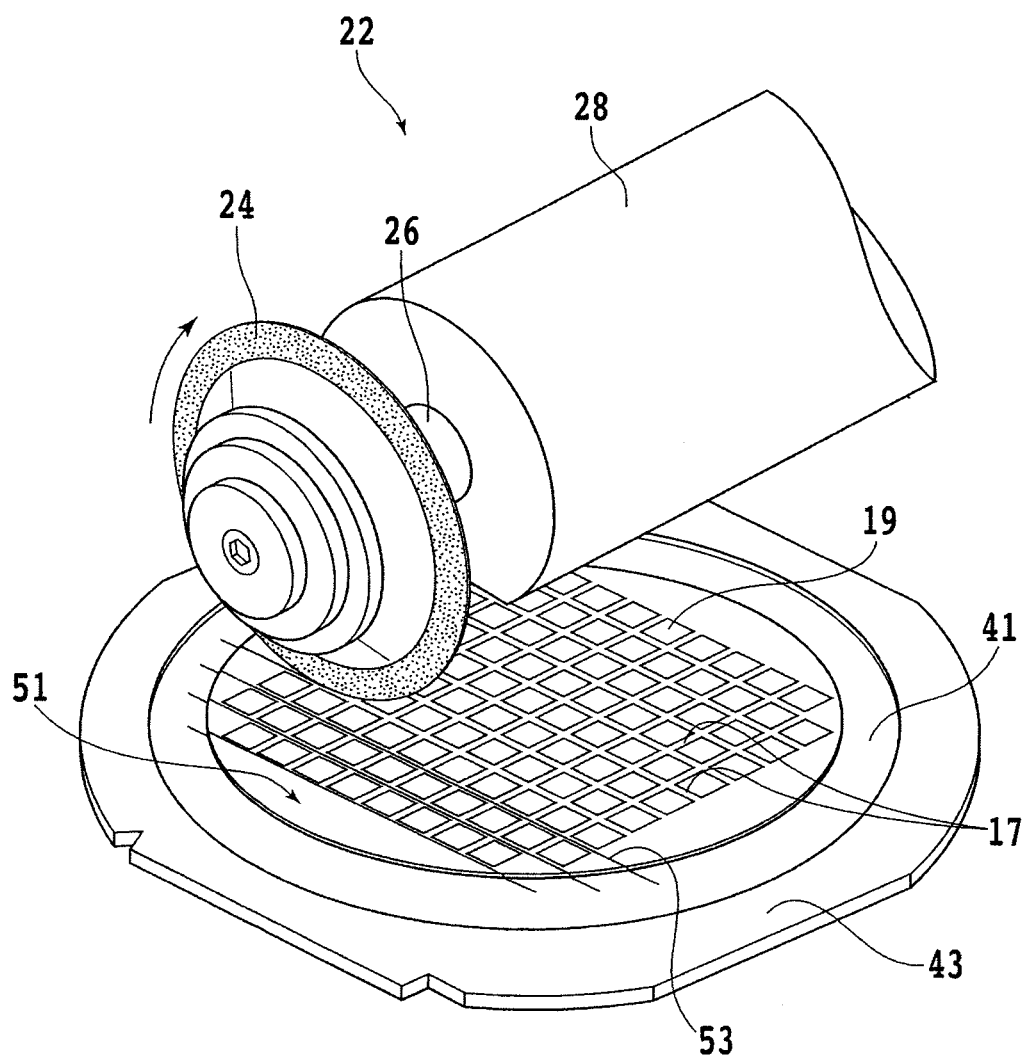
FIG. 5 is a perspective view showing schematically the dividing step.

After the annular projecting portion removing step is performed, the dividing step is carried out in which the wafer 51 is cut from the front surface 11a side thereof to form the dividing grooves corresponding to the predetermined division lines 17. FIG. 5 is a perspective view which schematically illustrates the dividing step. As shown in FIG. 5, the dividing step in this embodiment is carried out by a cutting apparatus 22. The cutting apparatus 22 has a holding table (not shown) for holding the wafer 51 by suction. The holding table is connected to a rotating mechanism (not shown) such as a motor, and is rotated about a rotational axis extending in the vertical direction. In addition, a moving mechanism (not shown) is provided under the holding table, and the holding table is moved horizontally by the moving mechanism. Over the holding table is disposed a cutting unit. The cutting unit includes an annular cutting blade 24. The cutting blade 24 is mounted to one end side of a spindle 26 disposed horizontally. The other end side of the spindle 26 is connected to a motor (not shown), and the cutting blade 24 is rotated by a rotating force of the motor. The spindle 26 is housed in a spindle housing 28.

In the dividing step in this embodiment, first, the dicing tape 41 attached to the wafer 51 is put in contact with a holding surface of the holding table, and a negative pressure of a suction source is applied there. This results in that the wafer 51 is suction held onto the holding table, with its front surface 11a side exposed upward. Next, the cutting blade 24 being rotated is caused to cut into the predetermined division line 17 intended, and the wafer 51 and the cutting blade 24 are put into a relative movement (processing feed) in a direction parallel to the predetermined division line 17. By this operation, the wafer 51 can be cut along the predetermined division line 17 intended, to form a dividing groove 53. Such an operation is repeated, and the dividing step is finished when the dividing grooves 53 have been formed along all the predetermined division lines 17.

In the wafer processing method according to this embodiment, also, the splitting groove forming step of forming the splitting groove 47 at the boundary between the recess 23 and the annular projecting portion 25 by dry etching is performed after the grinding step of grinding the back surface 11b side of the wafer 11 to form the recess 23 and the annular projecting portion 25, so that it is possible to form the splitting groove 47 and remove the annular projecting portion 25 without causing a cutting blade to cut into the wafer 11. Accordingly, such a trouble as breakage of the wafer 11 due to bending of a cutting blade can be prevented from occurring. Besides, since it is unnecessary to form the splitting groove 47 while avoiding the boundary between the recess 23 and the annular projecting portion 25, it is possible to securely obtain a sufficient number of devices 19 from the wafer 11. In other words, according to this embodiment, there is provided a wafer processing method by which breakage of the wafer 11 can be prevented from occurring and a sufficient number of devices 19 can be securely obtained from the wafer 11. The configurations, methods and the like in this embodiment can be combined, as required, with the configurations, methods and the like in the other embodiment.

It is to be noted that the present invention is not limited to the above embodiments, and various modifications are possible in carrying out the invention. For instance, while the mask 31 or 45 covering the annular projecting portion 25 corresponding to the peripheral marginal region 15 is formed in the above embodiments, a mask which does not cover the annular projecting portion 25 may be formed. Besides, the method for forming the mask 31 or 45 may be an arbitrary method. For example, the mask 31 or 45 can also be formed by such a method as photolithography.

In addition, while the wafer 11 undergoes dry etching from the back surface 11b side thereof in the splitting groove forming step and the dividing step in the first embodiment, the wafer 11 may be dry etched from the front surface 11a side thereof. Similarly, while the wafer 11 is subjected to dry etching from the front surface 11a side thereof in the splitting groove forming step in the second embodiment, the wafer 11 may be dry etched from the back surface 11b side thereof.

Besides, while the cutting blade 24 is caused to cut into the wafer 11 in the dividing step in the second embodiment, the method for dividing the wafer 11 is not restricted to this method. For instance, the dividing grooves 53 may be formed by laser ablation or the like. In addition, a method can also be used in which a laser beam having such a wavelength as to be absorbed in the wafer 11 with difficulty is applied to the wafer 11 so as to form an altered layer therein along each of the predetermined division lines 17, and thereafter an external force is applied to the wafer 11 so as to divide the wafer 11.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having a device region in which devices are formed respectively in regions on a front surface of the wafer sectioned by a plurality of crossing predetermined division lines and a peripheral marginal region surrounding the device region, the method comprising:
   a grinding step of grinding a back surface of the wafer to form, on a back side of the wafer, a recess corresponding to the device region and an annular projecting portion corresponding to the peripheral marginal region;
   a splitting groove forming step of forming, after the grinding step is conducted, a splitting groove for splitting the device region and the peripheral marginal region from each other at a boundary between the recess and the annular projecting portion, the splitting groove extending from the front surface of the wafer to reach the back surface of the wafer, wherein the splitting groove is formed by plasma etching; and
   a dividing step of forming dividing grooves along the predetermined division lines by plasma etching, the dividing grooves extending from the front surface of the wafer to reach the back surface of the wafer, and dividing the wafer along the predetermined division lines, wherein the dividing step is performed simultaneously with the splitting groove forming step,
   wherein the method further comprises:
   a front surface protective member disposing step of disposing a front surface protective member on the front surface of the wafer before the grinding step is conducted; and
   a mask forming step of forming a mask on the back surface of the wafer after the grinding step is performed and before the splitting groove forming step and the dividing step are conducted, the mask being such that a back surface region corresponding to the splitting groove formed at the boundary between the recess and the annular projecting portion and back surface regions corresponding to the predetermined division lines are exposed, and
   further wherein:
   the annular projecting portion includes an inner annular surface, and outer annular surface and an upper surface connecting the inner and outer annular surfaces, and
   the mask formed during the mask forming step includes a portion formed on the inner annular surface of the annular projecting portion.

2. The method of processing a wafer according to claim 1, wherein:
   the annular projecting portion includes an inner annular surface, and outer annular surface and an upper surface connecting the inner and outer annular surfaces, and
   the mask formed during the mask forming step includes a portion formed on the inner annular surface of the annular projecting portion and a portion formed on the upper surface of the annular projecting portion.

3. A method of processing a wafer having a device region in which devices are formed respectively in regions on a front surface of the wafer sectioned by a plurality of crossing predetermined division lines and a peripheral marginal region surrounding the device region, the method comprising:
   a grinding step of grinding a back surface of the wafer to form, on a back side of the wafer, a recess corresponding to the device region and an annular projecting portion corresponding to the peripheral marginal region; and
   a splitting groove forming step of forming, after the grinding step is conducted, a splitting groove for splitting the device region and the peripheral marginal region from each other at a boundary between the recess and the annular projecting portion, the splitting groove extending from the front surface of the wafer to reach the back surface of the wafer, wherein the splitting groove is formed by plasma etching;
   a transferring step that is performed after said grinding step and before said splitting groove forming step, wherein said transferring step includes attaching a dicing tape to the back side of the wafer such that the wafer is held by an annular frame via the dicing tape; and
   a mask forming step of forming a mask on the front surface of the wafer after the transferring step is performed, the mask being such that a front surface region corresponding to the splitting groove formed at the boundary between the recess and the annular projecting portion is exposed.

4. The method of processing a wafer according to claim 3, wherein said method further comprises a dividing step of forming dividing grooves along the predetermined division lines, and dividing the wafer along the predetermined division lines.

5. The method of processing a wafer according to claim 4, wherein said dividing step is performed with a rotating cutting blade.

6. The method of processing a wafer according to claim 4, wherein said dividing step is performed with a laser ablation.

7. A method of processing a wafer having a device region in which devices are formed respectively in regions on a front surface of the wafer sectioned by a plurality of crossing predetermined division lines and a peripheral marginal region surrounding the device region, the method comprising:

a grinding step of grinding a back surface of the wafer to form, on a back side of the wafer, a recess corresponding to the device region and an annular projecting portion corresponding to the peripheral marginal region; and a splitting groove forming step of forming, after the grinding step is conducted, a splitting groove for splitting the device region and the peripheral marginal region from each other at a boundary between the recess and the annular projecting portion, the splitting groove extending from the front surface of the wafer to reach the back surface of the wafer, wherein the splitting groove is formed by plasma etching, wherein the method also comprises:

a transferring step that is performed after said grinding step and before said splitting groove forming step, wherein said transferring step includes attaching a dicing tape to the back side of the wafer such that the wafer is held by an annular frame via the dicing tape, an annular projecting portion removing step in which the annular projecting portion that has been split from the device region during the splitting groove forming step is removed from the device region, and wherein the annular projecting portion removing step results in the back side of the device region being aligned with a lower surface of the annular frame.

\* \* \* \* \*